US012044047B2

(12) United States Patent
Scheiern et al.

(10) Patent No.: US 12,044,047 B2
(45) Date of Patent: *Jul. 23, 2024

(54) DOOR HANDLE ASSEMBLY FOR A MOTOR VEHICLE

(71) Applicant: ADAC Plastics, Inc., Grand Rapids, MI (US)

(72) Inventors: Keith Scheiern, Lowell, MI (US); Anne Adamczyk, Grand Rapids, MI (US); Alexander Gabier, Kentwood, MI (US); Josh Goulet, Dorr, MI (US); Ryan Bussis, Caledonia, MI (US)

(73) Assignee: ADAC Plastics, Inc., Grand Rapids, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/182,805

(22) Filed: Mar. 13, 2023

(65) Prior Publication Data

US 2023/0212892 A1 Jul. 6, 2023

Related U.S. Application Data

(63) Continuation of application No. 17/898,592, filed on Aug. 30, 2022, now Pat. No. 11,739,573, which is a
(Continued)

(51) Int. Cl.
*E05B 85/16* (2014.01)
*E05B 81/76* (2014.01)
(Continued)

(52) U.S. Cl.
CPC ............. *E05B 85/16* (2013.01); *E05B 81/77* (2013.01); *G01D 5/12* (2013.01); *G01R 27/2605* (2013.01); *G01R 27/2611* (2013.01); *E05B 77/34* (2013.01)

(58) Field of Classification Search
CPC ........... E05B 85/16; E05B 81/77; G01D 5/12; G01R 27/2605; G01R 27/2611
See application file for complete search history.

(56) References Cited

U.S. PATENT DOCUMENTS 6,075,294 A  6/2000 Van Den Boom et al.
7,576,631 B1 * 8/2009 Bingle ................. G07C 9/0069
                                                340/5.72
(Continued)

FOREIGN PATENT DOCUMENTS

CN  1216593 A  5/1999
CN  1524732 A  9/2004
(Continued)

OTHER PUBLICATIONS

European Office Action issued Jun. 27, 2022 for European Patent Application 18886992.9.
(Continued)

*Primary Examiner* — Alvaro E Fortich
(74) *Attorney, Agent, or Firm* — Barnes & Thornburg LLP

(57) ABSTRACT

A door handle assembly for a motor vehicle door may include first and second housing components configured to be secured together to form a housing with inner surfaces of the components facing one another, the housing configured to be mounted to the motor vehicle door to define a door handle, a first sensor is disposed along a first detection surface defined by at least a portion of an outer surface of the housing, and a second sensor is disposed along a second detection surface defined by at least another portion of the outer surface of the housing, wherein signals produced by the first and second sensors are configured to enable any of locking, unlocking, latching, unlatching, automatically opening and automatically closing of the motor vehicle door.

17 Claims, 12 Drawing Sheets

Related U.S. Application Data continuation of application No. 16/209,498, filed on Dec. 4, 2018, now Pat. No. 11,441,341.

(60) Provisional application No. 62/594,900, filed on Dec. 5, 2017.

(51) Int. Cl.
  *G01D 5/12* (2006.01)
  *G01R 27/26* (2006.01)
  *E05B 77/34* (2014.01)

(56) References Cited

U.S. PATENT DOCUMENTS

| | | |
|---|---|---|
| 7,654,147 B2 | 2/2010 | Witte et al. |
| 9,249,606 B2 | 2/2016 | Naka |
| 9,995,065 B2 | 6/2018 | Witte et al. |
| 10,662,682 B2 | 5/2020 | Beck et al. |
| 10,975,601 B2 | 4/2021 | Beck et al. |
| 11,286,694 B2 | 3/2022 | Beck et al. |
| 11,365,570 B2 | 6/2022 | Beck et al. |
| 2004/0223336 A1 | 11/2004 | Murakami et al. |
| 2005/0057047 A1 | 3/2005 | Kachouh et al. |
| 2006/0226953 A1 | 10/2006 | Shelley et al. |
| 2007/0069533 A1* | 3/2007 | Cummins ............... E05B 85/16 292/336.3 |
| 2008/0061933 A1 | 3/2008 | Ieda et al. |
| 2009/0133510 A1 | 5/2009 | Witte et al. |
| 2010/0205780 A1* | 8/2010 | Leda ...................... E05B 85/16 16/412 |
| 2010/0219935 A1* | 9/2010 | Bingle .................... E05B 81/76 340/5.54 |
| 2012/0133563 A1* | 5/2012 | Naka ....................... H01Q 7/08 343/713 |
| 2014/0069015 A1 | 3/2014 | Salter et al. |
| 2015/0225987 A1 | 8/2015 | Frattini et al. |
| 2015/0363987 A1 | 12/2015 | Kiriyama et al. |
| 2016/0230429 A1 | 8/2016 | Witte et al. |
| 2017/0016255 A1 | 1/2017 | Guibbert et al. |
| 2017/0159333 A1 | 6/2017 | Beck |
| 2017/0260778 A1* | 9/2017 | Witte ................ G07C 9/00174 |
| 2019/0257124 A1* | 8/2019 | Löw ..................... E05B 85/103 |

FOREIGN PATENT DOCUMENTS

| | | |
|---|---|---|
| CN | 101144350 A | 3/2008 |
| CN | 102544690 A | 7/2012 |
| CN | 103670068 A | 3/2014 |
| CN | 105089382 A | 11/2015 |
| DE | 102016112423 A1 | 1/2017 |
| DE | 102015122359 A1 | 6/2017 |
| EP | 1760227 A1 | 3/2007 |
| EP | 1910631 A | 4/2008 |
| EP | 2088267 A2 | 8/2009 |
| EP | 2087185 B1 | 6/2010 |
| EP | 2230367 A2 | 9/2010 |
| EP | 2458119 A2 | 5/2012 |
| EP | 3054069 A1 | 8/2016 |
| EP | 2088267 A2 | 8/2017 |
| JP | 2005-098030 A | 4/2005 |
| JP | 2008-069536 A | 3/2008 |
| JP | 2014-163145 A | 9/2014 |
| JP | 2015532953 A | 11/2015 |
| JP | 2017-008602 A | 1/2017 |

OTHER PUBLICATIONS

First Chinese Office Action for Patent Application 201880088531.7 issued Mar. 29, 2021.
Search Report for Chinese Application No. 201880088531.7 issued Mar. 19, 2021.
European Search Report issued Jul. 15, 2021 for European Patent Application 18886992.9-1005/3720134 PCTUS2018/063829
Search Report and Written Opinion from corresponding International Patent Application No. PCT/US2018/063829 dated Mar. 21, 2019.
European Office Action issued Mar. 22, 2022 for European Patent Application 18886992.9.
Japanese Office Action issued Apr. 18, 2022 for Japanese Application 2020-531573.
Office Action Issued Jan. 30, 2022 in Chinese Application 201880088531.7.
Search Report for counterpart Chinese application CN202211077885.6, dated Jul. 25, 2023 (english translation appended).

* cited by examiner

DOOR HANDLE ASSEMBLY FOR A MOTOR VEHICLE

CROSS-REFERENCE TO RELATED APPLICATION

This is a continuation of application Ser. No. 17/898,592, filed Aug. 30, 2022, which is a continuation of application Ser. No. 16/209,498, filed Dec. 4, 2018 and now U.S. Pat. No. 11,441,341, which claims the benefit of and priority to U.S. Provisional Patent Application Ser. No. 62/594,900, filed Dec. 5, 2017, the disclosures of which are all incorporated herein by reference in their entireties.

FIELD OF THE INVENTION

The present invention relates generally to door handle assemblies for motor vehicles, and more specifically to door handle assemblies including sensor-based control features.

BACKGROUND

Door handle assemblies for motor vehicles which include keyless entry features are generally known. It is desirable to provide improved door handle assemblies with one or more sensor-based control features.

SUMMARY

The present invention may comprise one or more of the features recited in the attached claims, and/or one or more of the following features and combinations thereof. In one aspect, a door handle assembly for a motor vehicle door may comprise a first housing component having an inner surface and an outer surface, a second housing component having an inner surface and an outer surface, the first and second housing components configured to be secured together to form a housing with the inner surfaces of the first and second housing components facing one another, the housing configured to be mounted to the motor vehicle door to define a door handle with at least part of the outer surface of the first housing component spaced apart from and facing the motor vehicle door, a first sensor mounted in the housing along a first detection surface defined by at least a portion of the outer surface of the first housing component, the first sensor configured to produce a first sensor signal upon detection of one of an object within a detection proximity of the first detection surface and deflection of at least a portion of the inner surface of the first housing component opposite the first detection surface to within a detection proximity of the first sensor, and a second sensor mounted in the housing along a second detection surface defined by at least a portion of the outer surface of the second housing component, the second sensor configured to produce a second sensor signal upon detection of one of an object within a detection proximity of the second detection surface and deflection of at least a portion of the inner surface of the second housing component opposite the second detection surface to within a detection proximity of the second sensor, wherein the first and second sensor signals are configured to enable any of locking, unlocking, latching, unlatching, automatically opening and automatically closing of the motor vehicle door.

In another aspect, a door handle assembly for a motor vehicle door may comprise a first housing component having an inner surface and an outer surface, a second housing component having an inner surface and an outer surface, the first and second housing components configured to be secured together to form a housing with the inner surfaces of the first and second housing components facing one another, the housing configured to be mounted to the motor vehicle door to define a door handle with at least part of the outer surface of the first housing component spaced apart from and facing the motor vehicle door, a first sensor mounted in the housing along a first detection surface defined by at least a portion of the part of outer surface of the first housing component facing the motor vehicle door, the first sensor configured to produce a first sensor signal upon deflection of at least a portion of the inner surface of the first housing component opposite the first detection surface to within a detection proximity of the inductive proximity sensor, and a capacitive proximity sensor mounted in the housing along a second detection surface defined by at least a portion of the outer surface of the second housing component, the capacitive proximity sensor configured to produce a second sensor signal upon detection of an object within a detection proximity of the second detection surface, wherein the first and second sensor signals are configured to enable any of locking, unlocking, latching, unlatching, automatically opening and automatically closing of the motor vehicle door.

In a further aspect, a door handle assembly for a motor vehicle door may comprise a first housing component having an inner surface and an outer surface, a second housing component having an inner surface and an outer surface, the first and second housing components configured to be secured together to form a housing with the inner surfaces of the first and second housing components facing one another and with outer surfaces of the first and second housing components together defining an outer surface of the housing, the housing configured to be mounted to the motor vehicle door to define at least a portion of a door handle, a first sensor mounted in the housing along a first detection surface defined by at least a portion of the outer surface of the housing, the first sensor configured to produce a first sensor signal upon detection of one of an object within a detection proximity of the first detection surface and deflection of at least a portion of the inner surface of the housing opposite the first detection surface to within a detection proximity of the first sensor, and a second sensor mounted in the housing along a second detection surface defined by at least another portion of the outer surface of the housing, the second sensor configured to produce a second sensor signal upon detection of one of an object within a detection proximity of the second detection surface and deflection of at least a portion of the inner surface of the housing opposite the second detection surface to within a detection proximity of the second sensor, wherein the first and second sensor signals are configured to enable any of locking, unlocking, latching, unlatching, automatically opening and automatically closing of the motor vehicle door.

BRIEF DESCRIPTION OF THE DRAWINGS

This disclosure is illustrated by way of example and not by way of limitation in the accompanying Figures. Where considered appropriate, reference labels have been repeated among the Figures to indicate corresponding or analogous elements.

DETAILED DESCRIPTION OF THE DRAWINGS

Figure 1:
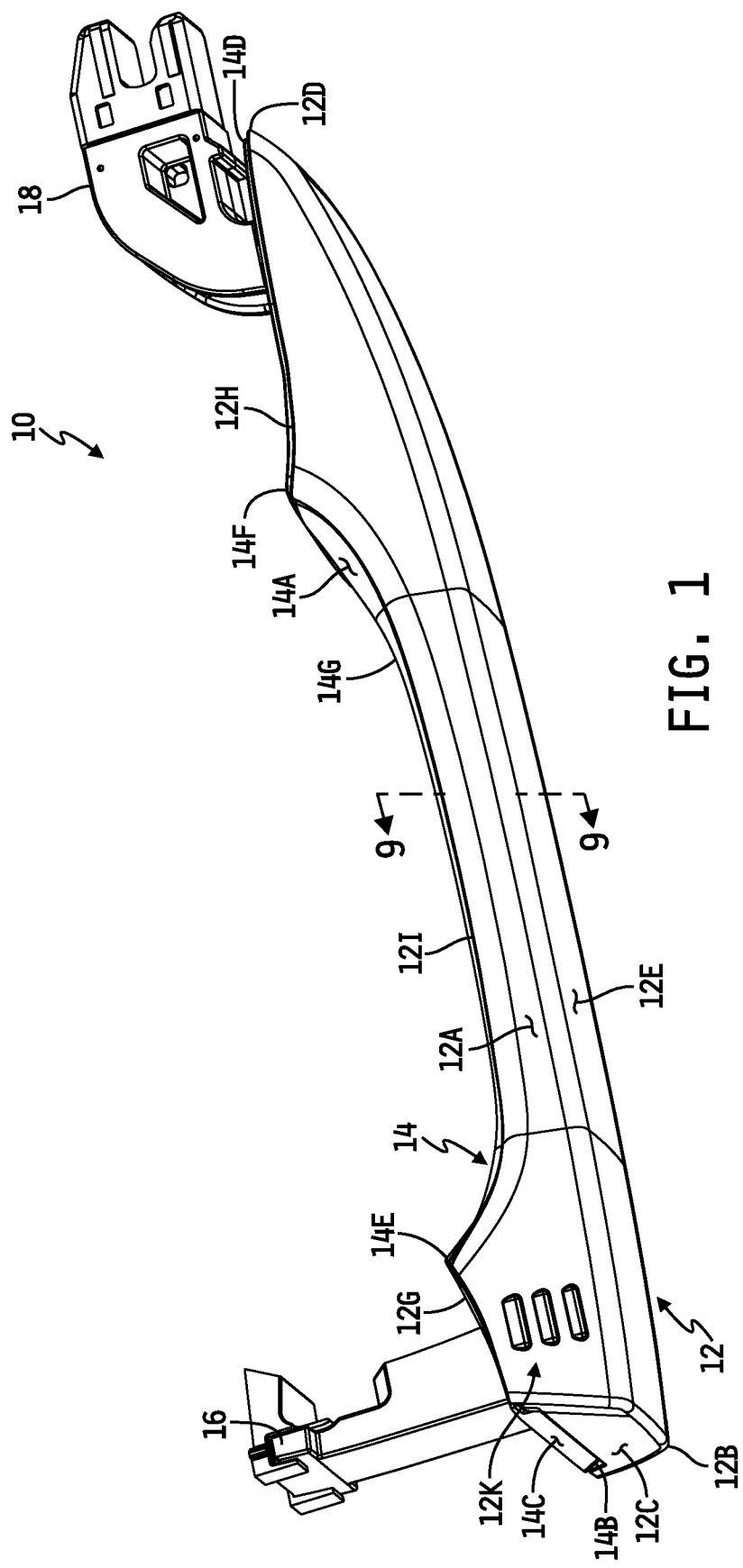
FIG. 1 is a front perspective view of an embodiment of a door handle assembly.

While the concepts of the present disclosure are susceptible to various modifications and alternative forms, specific exemplary embodiments thereof have been shown by way of example in the drawing and will herein be described in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases may or may not necessarily refer to the same embodiment. Further, when a particular feature, structure or characteristic is described in connection with an embodiment, it is submitted that it is within the knowledge of one skilled in the art to effect such feature, structure or characteristic in connection with other embodiments whether or not explicitly described. Further still, it is contemplated that any single feature, structure or characteristic disclosed herein may be combined with any one or more other disclosed feature, structure or characteristic, whether or not explicitly described, and that no limitations on the types and/or number of such combinations should therefore be inferred.

Referring now to FIG. 1, an embodiment is shown of a door handle assembly 10 for a motor vehicle. The door handle assembly 10 illustratively includes a grip cover 12 that mates with a handle base 14. The handle base 14 illustratively includes a pivot mount 18 configured to be pivotally mounted to an entry door of a motor vehicle and a latch actuator 16 operatively coupled with a door latch assembly located within the entry door. Together, the grip cover 12 and the handle base 14 form a grip configured to be grasped by a human hand. As will be described in greater detail below, the grip cover 12 and handle base 14 together form a housing which carries two sensors; one which may be triggered or otherwise activated to cause a door latch of the entry door to lock and thereby prevent manual actuation of the handle assembly 10 to open the entry door and/or to latch the handle assembly 10 to the entry door, and another which may be triggered or otherwise activated to cause the door latch of the entry door to unlock or unlatch so that the door handle assembly 10 may be manually actuated in a conventional manner to open the entry door.

In the illustrated embodiment, the grip cover 12 comprises opposing upper and lower walls 12A, 12B respectively and opposing side walls 12C, 12D respectively. All such walls 12A-12D are joined by an elongated and front wall 12E which may be at least partially arcuate. Between the side walls 12C, 12D, the upper and lower walls 12A, 12B of the grip cover 12 define a rear lip 12F which illustratively defines an arcuate and generally concave section 12I between and relative to two opposing end sections 12G, 12H (see FIG. 6). Between the rear lip 12F and interior surfaces of the upper and lower walls 12A, 12B, the side walls 12C, 12D and the rear surface 12J of the front wall 12E, the grip cover 12 defines an internal or interior space 12S. In one embodiment, the grip cover 12 is of uniform construction, although in other embodiments the grip cover 12 may be formed by securing together two or more component parts. The grip cover 12 may be formed of one or more conventional materials, and in one embodiment the grip cover 12 is a plastic component covered by a metallic film or coating to simulate a chrome handle. Alternatively or additionally, the plastic grip cover 12 may be covered by one or more colored films or coatings and/or by one or more clear films or coatings. In still other embodiments, the grip cover 12 may be formed of or include one or more coated or uncoated metals or metal composites.

The handle base 14 illustratively has opposing upper and lower walls 14A, 14B respectively and opposing side walls 14C, 14D respectively. All such walls 14A-14D are joined by an elongated rear wall 14G which is illustratively at least partially arcuate to match the at least partially arcuate shape of the front wall 12E of the grip cover 12. Between the side walls 14C, 14D, the upper and lower walls 14A, 14B of the handle base 14 define a front lip 14L which illustratively defines an arcuate and generally concave section between and relative to two opposing end sections configured to match the concave section 12I and end sections 12G, 12H of the grip cover 12 such that the front lip 14L of the handle base 14 receives in contact the rear lip 12F of the grip cover 12 when the grip cover 12 and the handle base 14 are brought together as illustrated in FIG. 1. Between the front lip 14L and interior surfaces of the upper and lower walls 14A, 14B, the side walls 14C, 14D and the front surface 14H of the rear wall 114G, the handle base 14 defines an internal or interior space 14S.

A latch actuator 16 extends rearwardly from the handle base 14 adjacent to one of the side walls 14C, and a pivot mount 18 extends rearwardly from the handle base 14 adjacent to the opposite side wall 14D. The latch actuator 16 is illustratively configured to operatively couple to a conventional door latch assembly carried by a door of a motor vehicle to which the handle assembly 10 is mounted (see, e.g., FIG. 10). The pivot mount 18 is illustratively configured to extend into the door and pivotally couple to one or more structures therein. Movement of the handle base 14 about the pivot mount 18 illustratively moves the latch actuator 16 to actuate the door latch assembly in a conventional manner to enable the user to open the motor vehicle door. Two bores 20A, 20B are formed through the handle base 14; one bore 20A is formed adjacent to the latch actuator 16 and the other bore 20B is formed adjacent to the pivot mount 18.

Adjacent to the latch actuator 16, the handle base 14 defines a protrusion 14E between the upper and lower walls 14A, 14B, and adjacent to the pivot mount 18 the handle base defines a protrusion 14F between the upper and lower walls 14A, 14B. Each protrusion 14E, 14F illustratively extends rearwardly from the handle base 14, and the arcuate rear wall 14G extends between the protrusions 14E, 14F and between the upper and lower walls 14A, 14B. As illustrated most clearly in FIGS. 10-13, the protrusions 14E, 14F extending rearwardly from the handle base 14 are illustratively sized and configured to contact the outer skin 100A of the motor vehicle door 100 when the door assembly 10 is mounted to the motor vehicle door 100, and a space 110 is defined between a portion 115 of the outer surface of the outer skin 100A of the door 100 and the rear surface 14R of the arcuate rear wall 14G of the handle base 14. The arcuate profile of the rear wall 14G of the handle base 14 is, along with sizes and shapes of the protrusions 14E, 14F, illustratively configured to produce the space 110 with a size and shape suitable to allow one or more fingers and at least a portion of a human hand 120 to extend sufficiently therein to come into contact with the rear surface 14R of the rear wall 14G so that the hand 120 can then grasp the combination of the handle base 14 and the grip cover 12 with at least one finger extending into the space 110 and wrapped around the rear surface 14R of the arcuate rear wall 14G of the handle base 14 in a conventional fashion.

In one embodiment the handle base 14 is of uniform construction, although in other embodiments the handle base 14 may be formed by securing together two or more component parts. The handle base 14 may be formed of one or more conventional materials, and in one embodiment the handle base 14 is a plastic component covered by one or more suitable films or coatings. In alternate embodiments, the handle base 14 may be formed of or include one or more other suitable coated or uncoated materials.

Figure 2:
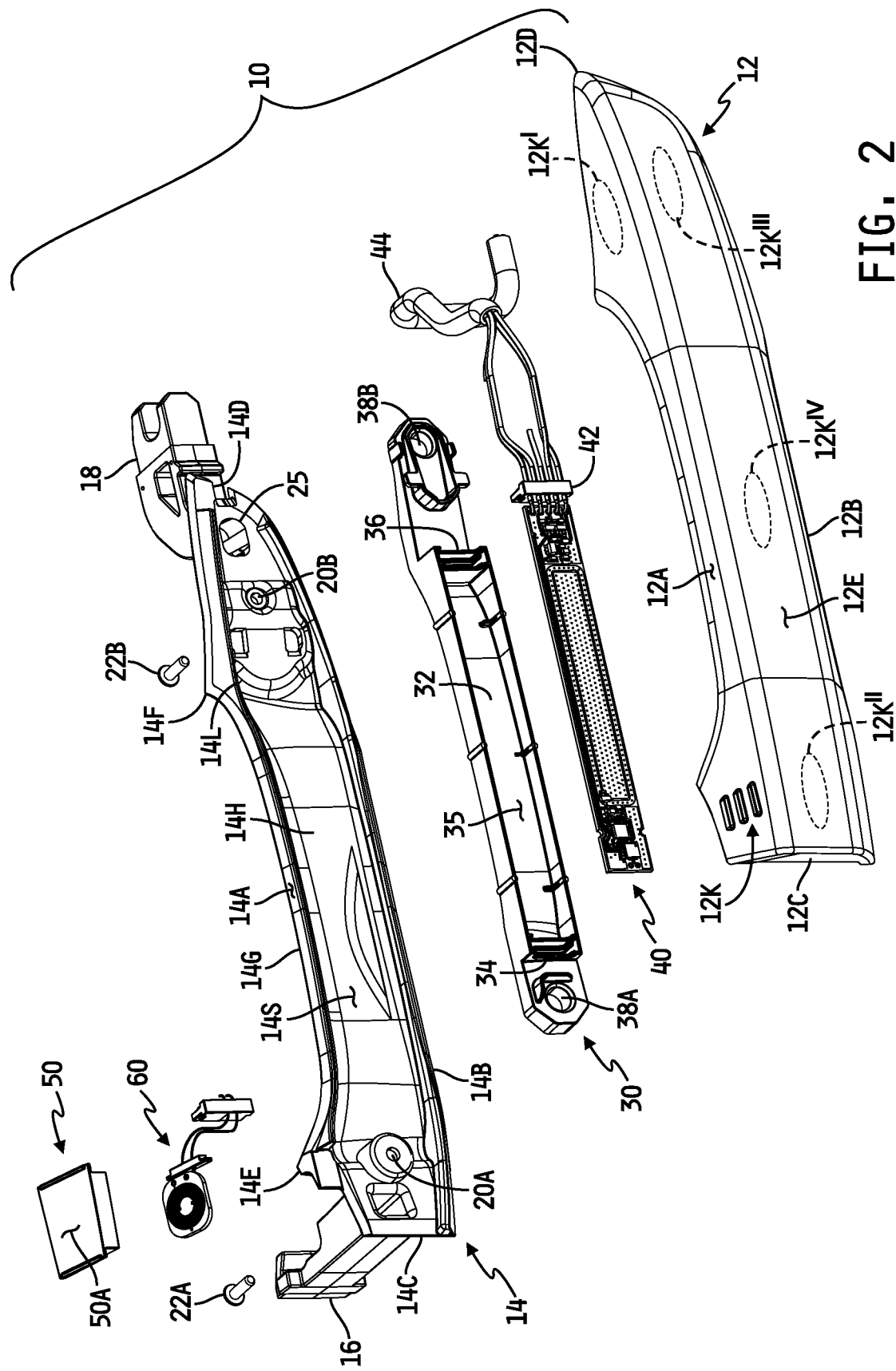
FIG. 2 is a front perspective exploded view of the door handle assembly depicted in FIG. 1.

The interior space 12S of the grip cover 12 and the interior space 14S of the handle base 14 together define a space sized to house electronic components when the grip cover 12 and the handle base 14 are secured together. Referring now to FIG. 2, the door handle assembly 10 illustratively further includes a circuit board carrier 30 to which a circuit board 40 is mounted, and the circuit board carrier 30 and circuit board 40 are together mounted within the space defined by and between the interior spaces 12S and 14S of the grip cover 12 and the handle base 14 respectively. A sensor cartridge 50 is received within the grip cover 12 separately from the circuit board carrier 30 and the circuit board 40, and a sensor assembly 60, including a sensor 62 (see also FIG. 4), mountable to the sensor cartridge 50 is electrically connectable to the circuit board 40. In the illustrated embodiment, and as will be described in greater detail below, the sensor assembly 60 is mounted to the sensor cartridge 50, and the sensor cartridge 50 is then mounted to the grip cover 12 such that the sensing surface of the sensor 62 is operatively spaced apart from a sensor triggering portion 12K of the grip cover 12. In some embodiments, the sensor triggering portion 12K of the grip cover 12K is configured to be visually identifiable with the naked eye. In other embodiments, the sensor triggering portion 12K may be visually identified via an illumination source carried within the grip cover 12. Although the sensor triggering portion 12K is illustrated in FIGS. 1 and 2 as being a portion of the upper wall 12A of the grip cover 12 adjacent to the side wall 12C, it will be understood that the sensor triggering portion 12K may alternatively be located anywhere along the upper wall 12A, e.g., such as the alternate portion 12K' of the top wall 12A adjacent to the side wall 12D as illustrated by dashed-line configuration in FIG. 2, or anywhere along the front wall 12E, e.g., such as the alternate portion 12K" of the front wall 12E adjacent to the side wall 12C, the alternate portion 12K''' adjacent to the side wall 12D or the alternate portion $12K^{IV}$ of the front wall 12E centrally between the side walls 12C, 12D each as illustrated by dashed-line configuration in FIG. 2. In any such alternate positioning of the sensor triggering portion 12K', 12K", 12K''', $12K^{IV}$ of the grip cover 12, it will be further understood that the sensor cartridge 50 and sensor 60 assembly will be suitably mounted to the grip cover 12 to position the sensing surface of the sensor 62 so as to be operatively spaced apart from the wall portion 12K', 12K", 12K''', $12K^{IV}$. In some embodiments, as will be described below, the sensor triggering portion 12K, 12K', 12K", 12K''', $12K^{IV}$ is made to be at least partially flexible so as to deflect inwardly upon application of external pressure, although in other embodiments the sensor triggering portion 12K, 12K', 12K", 12K''', $12K^{IV}$ may be made substantially rigid. In any case, the sensor trigger portion 12K, 12K', 12K", 12K''', $12K^{IV}$ may be made to be visually distinguishable from adjacent areas of the grip cover 12 by embossing, etching, e.g., laser etching, molding, machining or otherwise altering the physical appearance of the sensor trigger portion 12K, 12K', 12K", 12K''', $12K^{IV}$ relative to adjacent areas of the grip cover 12, and/or by configuring the sensor trigger portion 12K, 12K', 12K", 12K''', $12K^{IV}$ such that it is at least partially light-transmissive so that visible radiation emitted by one or more illumination sources carried within the grip cover 12 can be seen on and/or externally to the sensor trigger portion 12K, 12K', 12K", 12K''', $12K^{IV}$.

Figure 9:
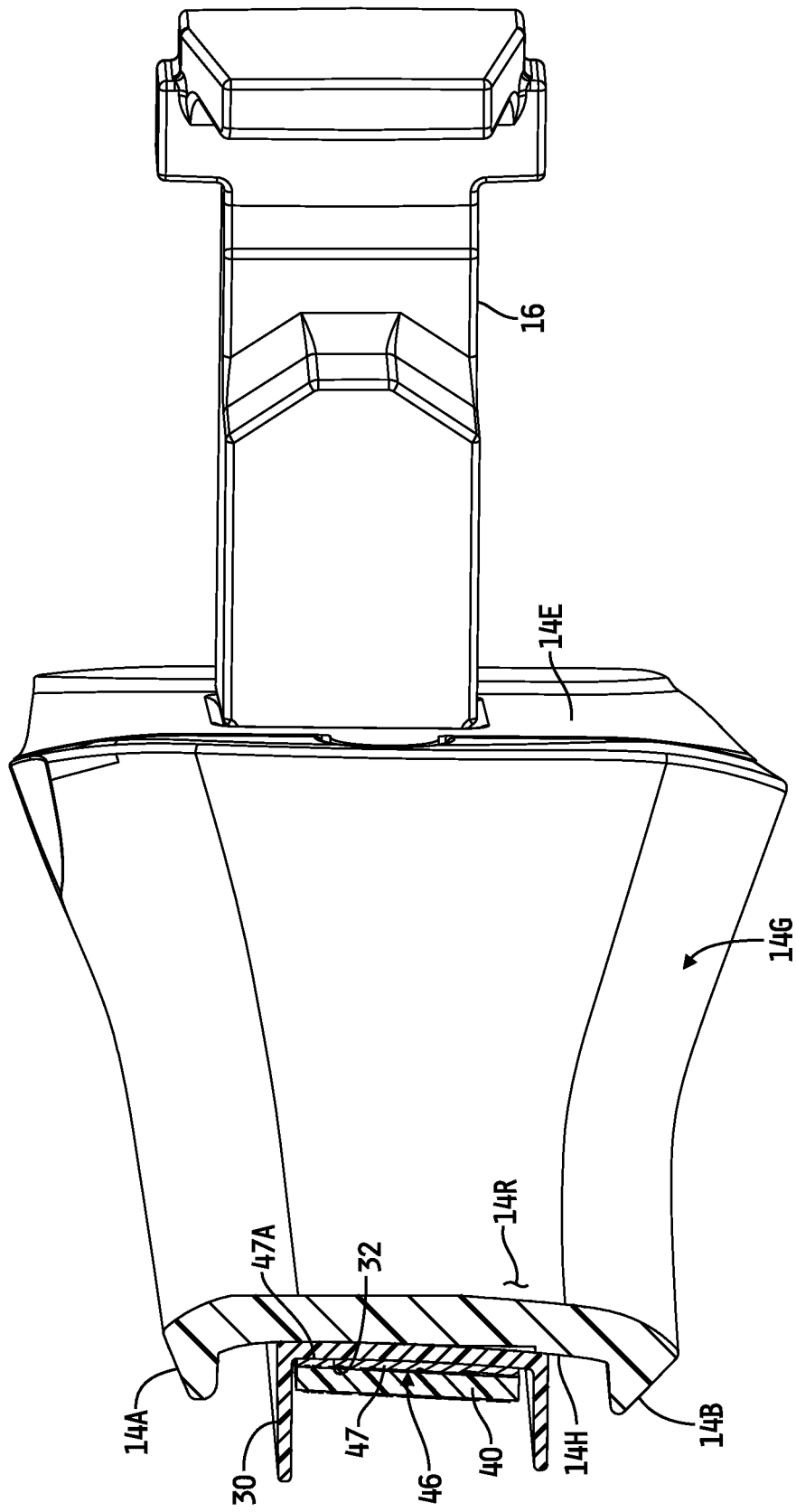
FIG. 9 is a cross-sectional view of the handle base of FIG. 1 as viewed along section lines 9-9 and with the grip cover omitted to illustrate an embodiment of a sensor positioned adjacent to the rear surface of the handle base.

The circuit board 40 illustratively has a number of electronic circuit components mounted thereto. Such electronic circuit components illustratively include another sensor (one example 46 of which is illustrated in FIG. 9), sensor signal conditioning circuitry in the form of at least one conventional sensor signal processing circuit 45 configured to process sensor signals produced by at least one of the sensors 46, 62 and, in some embodiments, one or more supporting electronic circuits. In some embodiments, another such electronic circuit component that may be mounted to the circuit board 40 may be or include a conventional processor configured to execute instructions stored in an on-board and/or externally connected memory unit. In embodiments which include such a processor, the on-board and/or externally connected memory unit illustratively has instructions stored therein which, when executed by the processor, cause it to produce control signals to control one or more features associated with the door handle assembly 10. In other embodiments, e.g., as illustrated by example in FIG. 10, such a processor 104 and memory 106 may both be located outside of the door handle assembly 10, e.g., within the door 100 or other area of a motor vehicle, and electrically connected to the circuit board 40 via suitable wiring 44. In either case, such features may include, but are not necessarily limited to, locking and unlocking of the door handle assembly 10. Alternatively or additionally, such features may include unlatching of the door handle assembly 10, i.e., controlling the latch actuator 16 and/or a door latch assembly 102 of the motor vehicle to automatically uncouple the latch actuator 16 from the door latch assembly 102, latching of the door handle assembly 10, i.e., controlling the latch actuator 16 and/or a door latch assembly 102 of the motor vehicle to automatically couple the latch actuator 16 to the door latch assembly 102, activating and/or deactivating the door latch assembly 102 to automatically close and/or open the motor vehicle door in embodiments in which the door latch assembly 102 is or includes an automatic door opening/closing/assist apparatus and the motor vehicle door is provided in the form of an access closure with power open/close assist features, e.g., such as a power lift gate, a power rear door, a power side door, a power sliding door or the like. Alternatively or additionally still, in embodiments in which one or more illumination sources is/are mounted to the circuit board 40 and/or elsewhere on or within the door handle assembly 10, such features may include selectively illuminating one or more portions of the door handle assembly 10 and/or one or more portions of the motor vehicle door 100 to which the door handle assembly 10 is mounted. Alternatively or additionally still, such one or more features may include processing a sequence of detectable changes in signals produced by either or both of the sensors, e.g., the sensors 46, 62, and/or other or additional sensors carried by the assembly 10, and comparing such a sequence to a predefined or pre-set sequence for the purpose of determining whether to lock, unlock, latch, unlatch, close and/or open the door handle assembly 10. Alternatively or additionally still, such one or more features may include processing a sequence of detectable changes in signals produced by either or both of the sensors, e.g., the sensors 46, 62, and/or other or additional sensors carried by the assembly 10, to selectively control, i.e., activate, deactivate, select and/or position, one or more driver and/or passenger settings within motor vehicle, e.g., one or more interior light settings, one or more entertainment system settings, one or more climate control settings, one or more seat position settings, one or more steering wheel position settings, one or more rear view mirror position settings, one or more side mirror position settings, one or more window and/or sunroof position settings, and/or the like. Alternatively or additionally still, such one or more features may include processing a sequence of detectable changes in signals produced by either or both of the sensors, e.g., the sensors 46, 62, and/or other or additional sensors carried by the assembly 10, to selectively control, i.e., activate, deactivate, select and/or position, one or more exterior structures and/or features of motor vehicle when the vehicle is parked/stationary, e.g., a position of one or more of motor vehicle side mirrors, e.g., folded against the motor vehicle or unfolded to an operative position, one or more window and/or sunroof position settings, one or more external motor vehicle lights, or the like.

Figure 3:
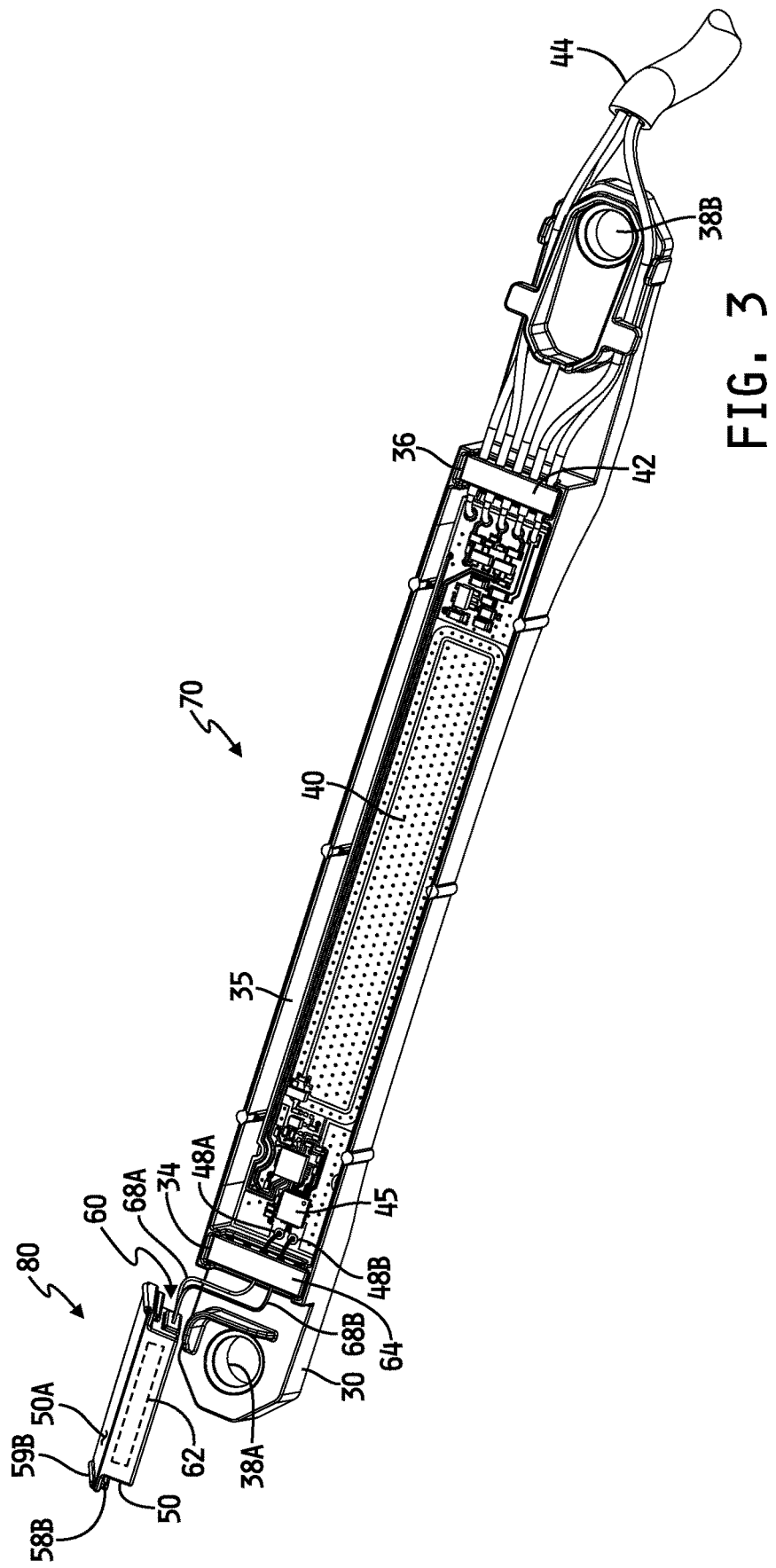
FIG. 3 is a perspective view of a circuit board subassembly of the door handle assembly of FIG. 2 in which the circuit board is mounted to the circuit board carrier and the sensor cartridge assembly is electrically connected to the circuit board.

The circuit board carrier 30 illustratively has a rear wall 32 from which top and bottom flanges forwardly extend to form a pocket 35 sized and configured to receive the circuit board 40 therein as depicted in FIG. 3. At one end of the pocket 35, the circuit board carrier 30 defines a slot 34 sized and configured to receive therein a wiring block 64 associated with the sensor assembly 60 (see FIG. 4), and at an opposite end of the pocket 35 the circuit board carrier 30 defines another slot 36 sized and configured to receive therein another wiring block 42 which supports and isolates the wiring 44 electrically connected to the electronic circuitry carried by the circuit board 40. The wiring 44 is illustratively fed externally from the door handle assembly 10 through an opening 25 defined through the handle base 14. A bore 38A is formed through the circuit board carrier 30 between the slot 34 and one end thereof, and another bore 38B is formed through the circuit board carrier 30 between the slot 36 and an opposite end thereof. The bores 38A, 38B align with the bores 20A, 20B of the handle base 40, and conventional fixation members 22A, 22B, e.g., screws, are sized to extend through the aligned bores 20A, 38A, 20B, 38B (see also FIG. 1) to mount the circuit board carrier 30 to the handle base 14.

Referring now to FIG. 3, the circuit board 40 is shown mounted to the circuit board carrier 30 to form a circuit board subassembly 70. In the illustrated embodiment, the circuit board 40 is received within the pocket 35 of the circuit board carrier 30 with the wiring block 42 electrically connected to the circuit board 40 and to the wiring 44 received within the slot 36. Also shown in FIG. 3 is the sensor 62 of the sensor assembly 60 mounted to and within the sensor cartridge 50 to form a sensor cartridge assembly 80, and the wiring block 64 associated with the sensor assembly 62 received within the slot 34 of the circuit board carrier.

Figure 5:
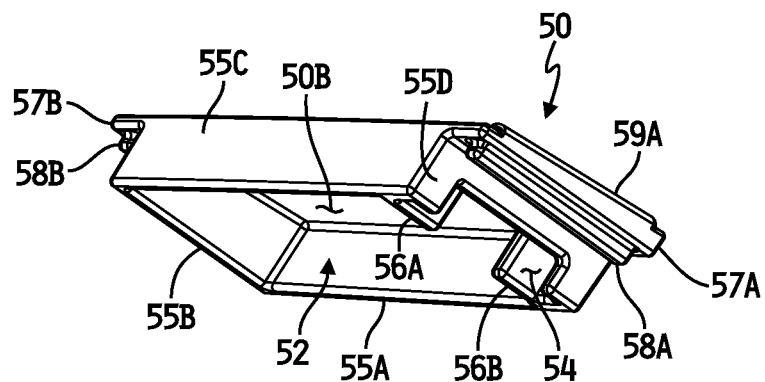
FIG. 5 is a perspective view of the sensor cartridge illustrated in FIGS. 2 and 3.
Figure 4:
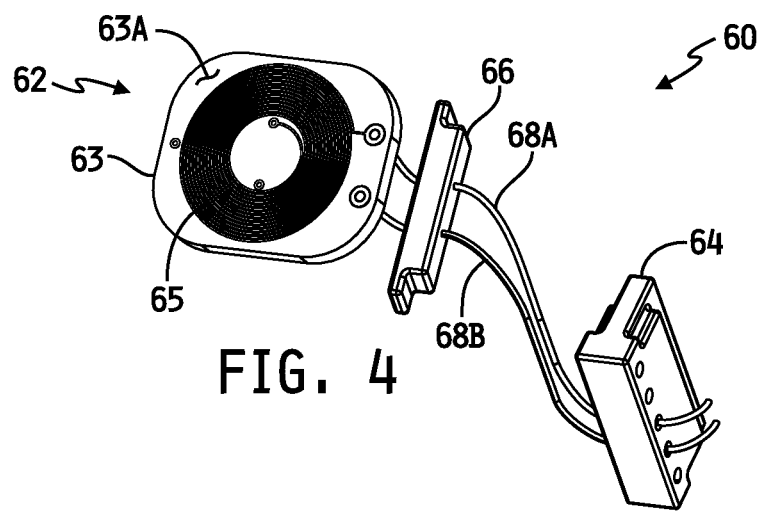
FIG. 4 is a perspective view of the sensor assembly illustrated in FIGS. 2 and 3.

As illustrated by example in FIG. 4, the sensor assembly 60 includes a sensor 62 in the form of an inductive sensor. The sensor 62 includes a planar substrate 63 having a planar sensor surface 63A upon which a sensor coil 65 is disposed and electrically connected to two wires 68A, 68B. Each of the wires 68A, 68B connected to the sensor coil 65 passes successively through a pair of wiring blocks 66 and 64 respectively configured to support the wires 68A, 68B in a conventional manner. An example embodiment of the sensor carrier 50 is illustrated in FIG. 5 and includes a planar member 52 defining a planar top surface 50A (see FIG. 1) and a bottom planar surface 50B, opposite the top planar surface 50A, from which surrounding sidewalls 55A-55D extend normally away. A pair of spaced apart interior sidewalls 56A, 56B extend normally away from the bottom planar surface 50B of the planar member 52 adjacent to the sidewall 55D which is also formed of spaced apart walls to form a slot 54 through the walls 55D, 56A, 56B sized to receive the wiring block 66 therein. A flange 57A extends away from one side of the planar member 52 adjacent and generally normal to the sidewall 55B, and another flange 57B extends away from an opposite side of the planar member 52 adjacent and generally normal to the sidewall 55D. The flanges 57A, 57B are generally parallel with the planar top and bottom surfaces 50A, 50B of the planar member 52. A pair of protrusions 58A and 59A extend generally perpendicularly away from the bottom and top surfaces respectively of the flange 57A, and a pair of protrusions 58B and 59B likewise extend generally perpendicularly away from the bottom and top surfaces respectively of the flange 57B.

As illustrated in FIG. 3, the sensor 62 is received and mounted within the pocket formed between the planar member 52 and the sidewalls 55A-55D of the sensor cartridge 50 such that the sensor surface 63A of the sensor substrate 63 faces the bottom planar surface 50B of the planar member 52. The wiring block 66 is received within the slot 54 formed between the sidewalls 55D, 56A, 56B with the wires 68A, 68B extending through the gaps formed between the sidewalls 56A, 56B and the spaced apart portions of the sidewall 55D. In some embodiments, a suitable mounting compound may be disposed in the pocket of the sensor carrier 50 to secure the sensor 62 therein. In any case, the sensor 62 is carried within the pocket of the sensor cartridge with the planar sensor surface 63A of the sensor substrate 63 spaced apart from and generally parallel with the planar top surface 50A of the sensor cartridge 50.

With the sensor 62 positioned within the sensor cartridge 50 as illustrated in FIG. 3, the wiring block 64 of the sensor assembly 60 is positioned in the slot 34 defined by the circuit board carrier 30, and the wires 68A, 68B extending from the wiring block 64 are electrically connected to corresponding electrical terminals 48A, 48B mounted to the circuit board 40 and electrically coupled to one or more electronic components carried by the circuit board 40. The wiring blocks 64, 66 support the sensor wires 68A, 68B and isolate the wires 68A, 68B from the sensor circuit board carrier 30 and the sensor cartridge 50 respectively.

Figure 6:
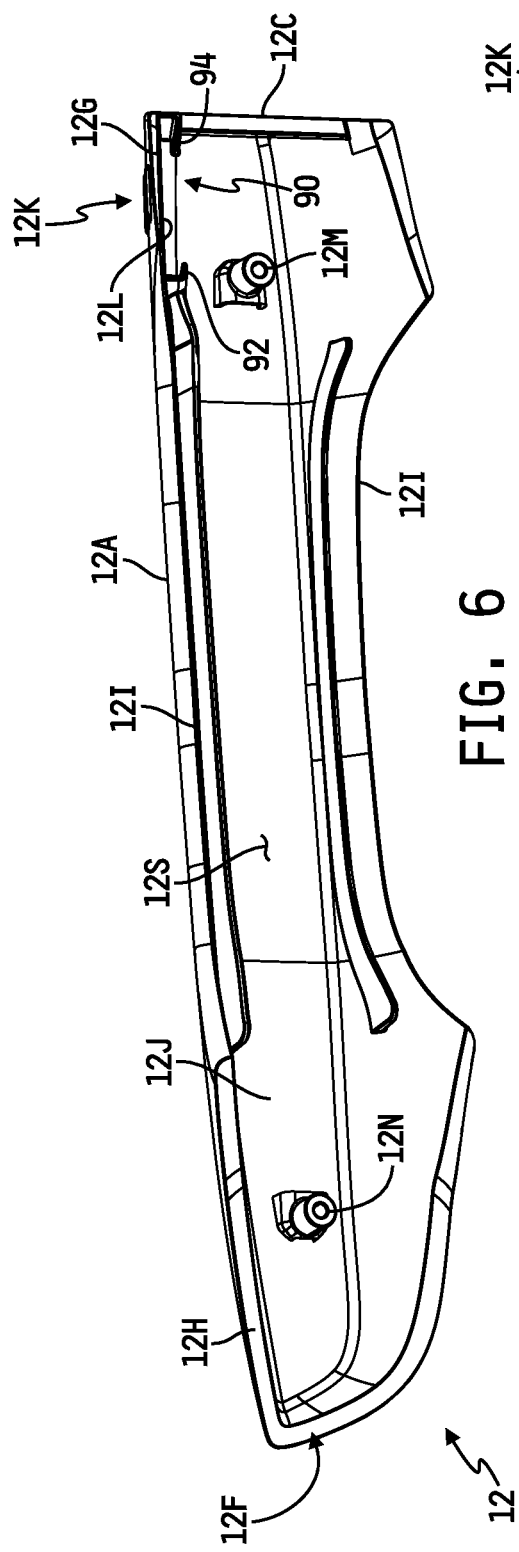
FIG. 6 is a rear perspective view of the grip cover depicted in FIGS. 1 and 2.
Figure 7:
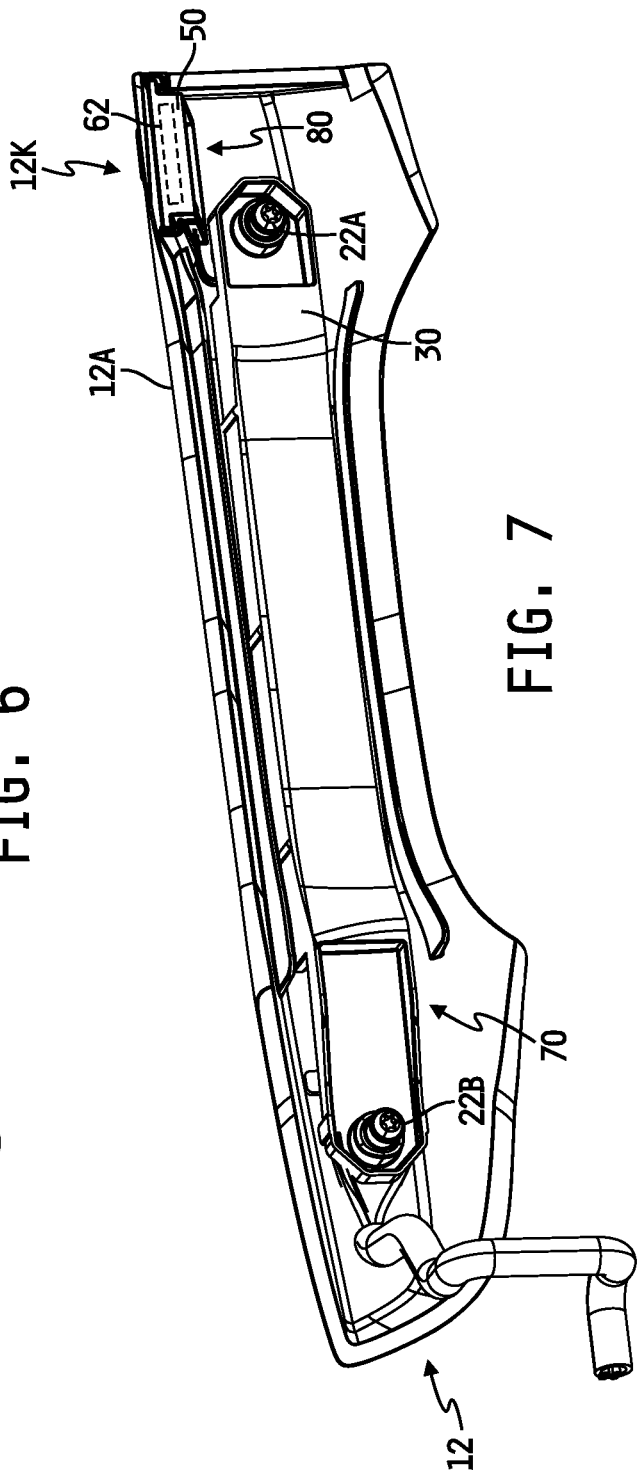
FIG. 7 is a rear perspective view similar to FIG. 6 and further illustrating mounting therein of the circuit board subassembly.

Referring now to FIG. 6, the back or rear side of the grip cover 12 is shown in which the rear surface 12J of the front wall 12E defines a pair of spaced apart receptacles 12M, 12N each sized and configured to receive and engage a respective one of the fixation members 22A, 22B illustrated in FIG. 1. As illustrated by example in FIG. 7, the spaced apart receptacles 12M, 12N align with the bores 38A, 38B of the circuit board carrier 30 such that the fixation members 22A, 22B secure the circuit board assembly 70 to the grip cover 12. It will be understood that the fixation members 22A, 22B further secure the handle base 14 to the grip cover 12 with the circuit board subassembly 70 mounted therebetween in the space defined by the interior spaces 12S, 14S of the two components, and that the handle base 14 is omitted in FIG. 7 to illustrate attachment of the circuit board assembly 70 to the grip cover 12.

Figure 8A:
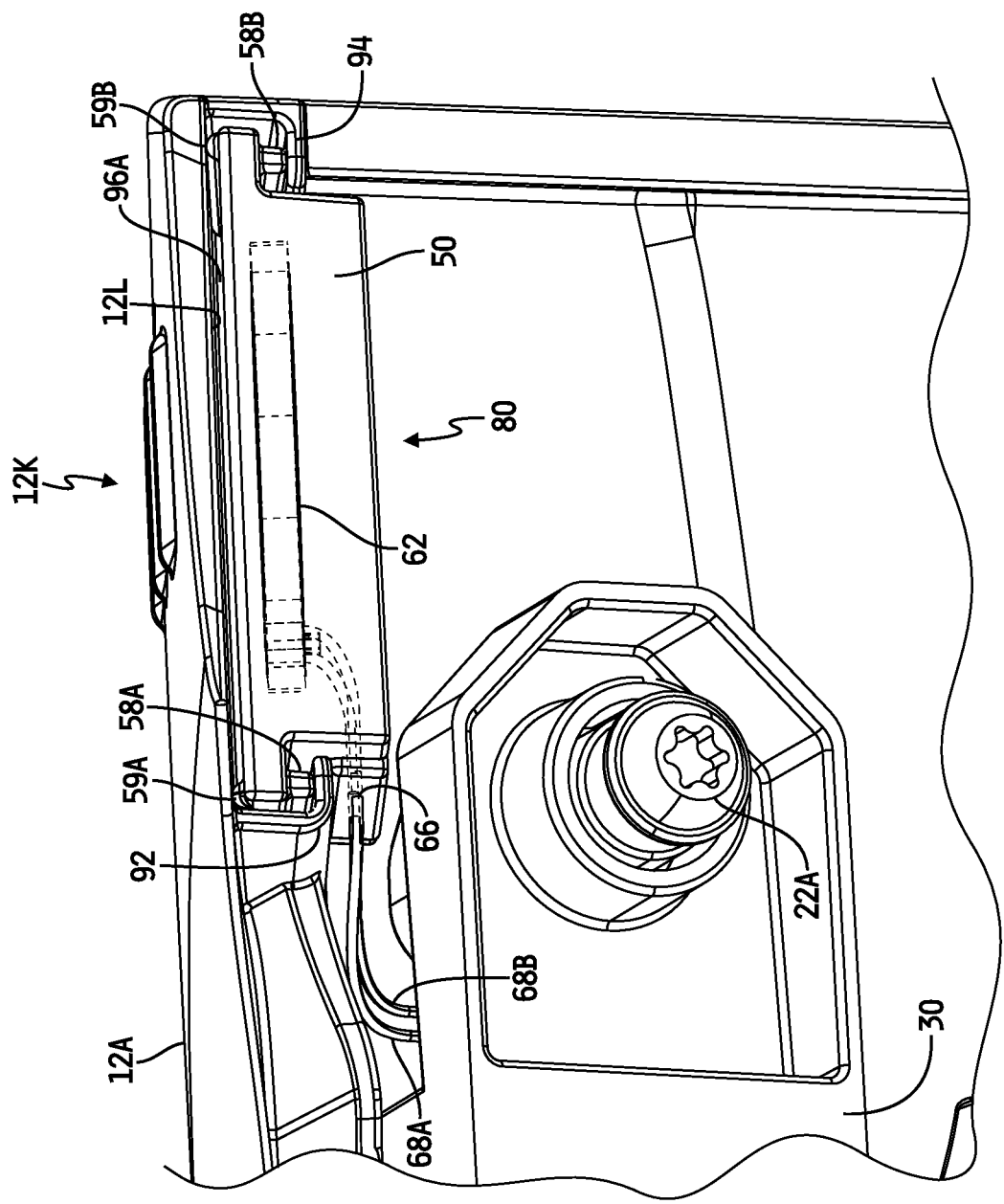
FIG. 8A is a magnified view of a portion of the rear side of the grip cover illustrating mounting of the sensor cartridge assembly thereto.
Figure 8B:
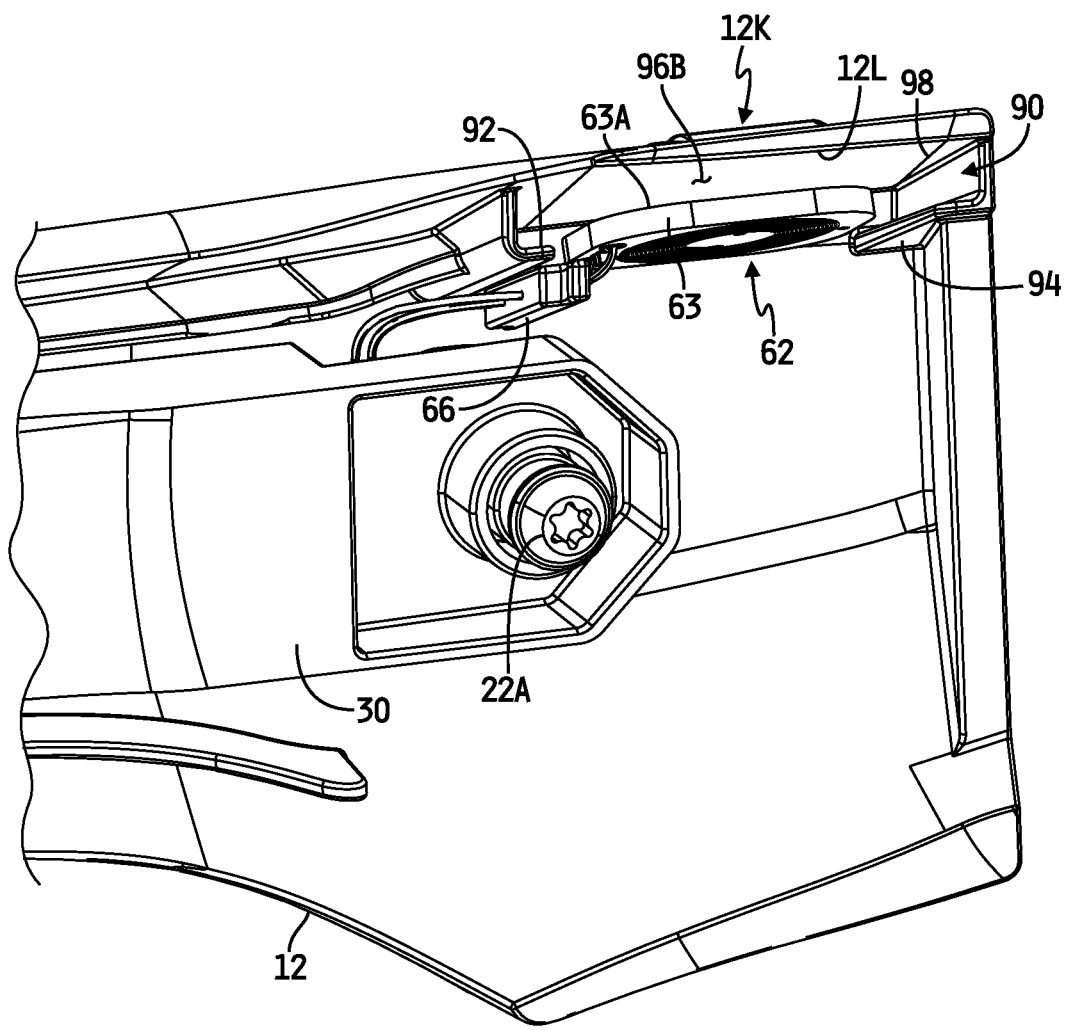
FIG. 8B is a magnified view similar to FIG. 8A but with the sensor cartridge omitted to illustrate positioning of the sensor relative to the grip cover.

As further illustrated in FIGS. 6-8B, the interior space 12S of the grip cover 12 defines a slot 90 sized and configured to receive the sensor cartridge 50 of the sensor cartridge assembly 80 therein. The slot 90 is illustratively defined adjacent to the side wall 12C of the grip cover 12 and is bordered along its top by a generally planar portion 12L of the inner surface of the top wall 12A of the grip cover 12. The portion 12L of the inner surface of the top wall 12A is defined opposite the sensor triggering portion 12K between opposing ears 92, 94 projecting downwardly from the inner surface of the top wall 12A of the grip cover 12 into the space 12S. The slot 90 defined between the inner surface 12L of the grip cover 12 and the opposing ears 92, 94 is sized to receive the sensor cartridge 50 therein with the slot 54 of the sensor cartridge 50 and the wiring block 64 received therein facing away from the side wall 12C so as to direct the wires 68A, 68B inwardly toward the circuit board 40. As most clearly illustrated in FIGS. 8A and 8B, the projections 58A, 58B and 59A, 59B operate to position the top planar surface 50A of the sensor cartridge 50, and thus the planar sensing surface 63A of the sensor substrate 63, spaced apart from and generally parallel with the planar portion 12L of the inner surface of the top wall 12A of the grip cover 12. As illustrated in FIG. 8A, with the sensor cartridge 50 positioned in the slot 90, a space 96A is defined between the portion 12L of the inner surface of the top wall 12A and the top planar surface 50A of the sensor cartridge 50 which, in turn, defines a space 96B between the portion 12L of the inner surface of the top wall 12A and the planar sensing surface 63A of the sensor substrate 63 on which the sensor coil 65 is disposed as illustrated in FIG. 8B.

As further illustrated in FIG. 8B, an electrically conductive film, layer or plate 98 is secured to the portion 12L of the inner surface of the top wall 12A so as to be positioned opposite and spaced apart from the sensor coil 65 disposed on the planar sensing surface 63A of the sensor substrate 63 when the sensor cartridge 50 carrying the sensor 62 is received within the slot 90. Examples of the conductive film, layer or plate 98 may include, but are not limited to, any metallic or other electrically conductive film, e.g., chrome or other material(s), painted, deposited or otherwise formed on the portion 12L of the inner surface of the top wall 12A of the grip cover 12, a tape having one or more electrically conductive layers and/or particles affixed thereto or embedded therein and one or more bonding media, e.g., adhesive or other bonding media, applied thereto for affixing the tape to the portion 12L of the inner surface of the top wall 12A, one or more rigid or semi-rigid electrically conductive sheets or plates affixed in any manner to the portion 12L of the inner surface of the top wall 12A, or the like.

In the illustrated embodiment, at least the portion of the top wall 12A defining the sensor triggering portion 12K is made to be at least partially flexible such that the portion 12L of the inner surface of the top wall 12A is displaced inwardly toward the sensor coil 65 in response to pressure or force applied to the sensor triggering portion 12K of the top wall 12A by, e.g., a digit of a human hand. Operation of the inductive sensor 62 is conventional in that the sensor coil 65 is energized by circuitry on the circuit board 40 to create a sensor output signal in the form of an electromagnetic field adjacent to the planar sensing surface 63A of the sensor substrate 63. In one example embodiment, circuitry on the circuit board 40 includes a capacitive component electrically connected to the sensor coil 65 through the wires 68A, 68B such that the capacitive component and the sensor coil 65 together form a resonant circuit. In some embodiments, the resonant circuit may include at least one or more additional passive components such as one or more resistive elements, although in other embodiments the resistive element of the resonant circuit may be provided in the form of inherent resistance in either or both of the capacitive component and the sensor coil 65. In any case, a time-varying signal is applied to the resonant circuit to produce a time-varying electromagnetic field. The size of the sensor coil 65 and the strength of the electromagnetic field established by the energized sensor coil 65 are selected such that the time-varying electromagnetic field extends across the space 96B to the electrically conductive film or plate 98. When the portion 12L of the inner surface of the top wall 12A of the grip cover 12 deflects inwardly a sufficient distance relative to the surrounding portions of the grip cover 12 in response to corresponding external pressure or force applied to the portion 12L of the top wall 12A, the electrically conductive film or plate 98 is displaced to within a detection proximity of the sensor coil 65. This results in a measurable loss in the resonant circuit which can be measured as a detectable change in the output signal of the sensor 62. In one embodiment, this detectable change in the output signal of the sensor 62 is measured as a change in frequency over time, although in alternate embodiments the detectable change in the output signal of the sensor 62 may be measured as a change over time in capacitance, inductance and/or resistance, e.g., relative to reference components onboard the circuit board 40. In some alternate embodiments, the sensor 62 may illustratively be affixed to or formed on, e.g., printed on, the portion 12L of the top wall 12A of the grip cover 12, and the electrically conductive film, layer or plate 98 may be affixed to or formed on the carrier 50. In any case, the sensor 62 may, in some embodiments, be configured to be responsive to different magnitudes or levels of pressure applied to the portion 12K, 12K', 12K'', 12K''', 12K$^{IV}$ of the grip cover 12 to produce distinguishably different sensor output signal magnitudes, and in some such embodiments different pressure(s) applied to the portion 12K, 12K', 12K'', 12K''', 12K$^{IV}$ of the grip cover 12 may result in different functions carried out by the door handle assembly 10 and/or by one or more actuators or systems of the motor vehicle.

The mounting arrangement of the sensor cartridge 50 to and within the grip cover 12 as just described is illustratively implemented in some embodiments to minimize or at least reduce the possibility of unintended or "false" triggering of the sensor 62 due to movement of the grip cover 12 relative to the structure(s) to which the sensor 62 may otherwise be mounted. In particular, mounting the sensor cartridge 50 carrying the sensor 62 to the grip cover 12 as just described causes the sensor cartridge 50, and thus the sensor 62, to move along with any movement generally of the grip cover 12. As long as any such movement of the grip cover 12 does not cause deflection of the sensor triggering portion 12L relative to surrounding portions of the grip cover 12, no detectable change in the output signal of the sensor coil 65 will occur. It is only when the sensor triggering portion 12L deflects inwardly relative to the surrounding portions of the grip cover 12 by an amount sufficient to cause a detectable change in the output signal of the sensor coil 65 that triggering of the sensor 62 will occur as described above. If the sensor 62 is otherwise mounted to the handle base 14, the circuit board carrier 30 or the circuit board 40 and the electrically conductive film or plate 98 is secured to a portion of the grip cover 12 opposite the sensor 62, any movement of any portion of the grip cover 12 that causes the film or plate 98 to move sufficiently toward or away from the sensor 62 may result in unintended and thus "false" triggering of the sensor 62. Although such "false" triggering of the sensor 62 may be more likely if the sensor 62 is not mounted to the grip cover 12 as described above, this disclosure contemplates embodiments in which the sensor 62 is mounted to one or any combination of the handle base 14, the circuit board carrier 30 and the circuit board 40.

Referring now to FIG. 9, another sensor 46 is illustratively carried by the door handle assembly 10 and is configured to detect objects proximate to or in contact with the rear surface 14R of the arcuate rear wall 14G of the handle base 14. In the illustrated embodiment, such a sensor 46 is illustratively provided in the form of an electrically conductive film, coating or plate 47 facing the front surface 14H of the rear wall 14G of the handle base 14 and electrically connected to circuitry carried by the circuit board 40. In the illustrated embodiment, the film, coating or plate 47 is affixed to the bottom surface of the circuit board 40, although in alternate embodiments the film, coating or plate 47 may be or be affixed to the front or rear surface of the rear wall 32 of the circuit board carrier 30, and in still other embodiments the film, coating or plate 47 may be or be affixed to the front surface 14H of the handle base 14 or otherwise disposed so as to be suitably spaced apart from the rear surface 14R of the handle base 14. In any case, the film, coating or plate 47 may be provided in any of the forms described by example above with respect to the electrically conductive film, layer or plate 98, wherein any such film, coating, layer or plate material is electrically connected to circuitry carried by the circuit board 40 as described below.

The film, coating or plate 47 electrically connected to circuitry carried by the circuit board 40 forms one electrode of a conventional capacitive sensor 46. In the illustrated embodiment, portions of the rear wall 32 of the circuit board carrier 30 and the rear wall 14G of the handle base 14 aligned with outwardly facing surface 47A of the film, coating or plate 47 together form a dielectric of the capacitive sensor, and circuitry on-board the circuit board 40 applies a time-varying, e.g., AC signal, to the film, coating or plate 47 which causes the film, coating or plate 47 to create a time-varying electric field. As long as no object is placed sufficiently close to the rear surface 14R of the rear wall 14G of the handle base 14, the time-varying electric field will not measurably change. Placing an object sufficiently close to the rear surface 14R of the rear wall 14G will induce a change the electric field produced by the film, coating or plate 47 which can be measured as a detectable change in the output signal of the sensor 46. In one embodiment, this detectable change in the output signal of the sensor 46 is measured as a change in voltage over time, although in alternate embodiments the detectable change in the output signal of the sensor 46 may be measured as a change over time in current or as a change over time in capacitance, e.g., relative to a reference capacitor onboard the circuit board 40. In one embodiment, the size of the film, coating or plate 47, the amplitude of the time-varying applied thereto, the thickness of the dielectric materials and the dielectric constant of the combined dielectric materials are illustratively selected so that at least a portion of a human hand, e.g., one or more fingers, within a detection proximity of the rear surface 14R of the rear wall 14G of the handle base 14 will trigger the sensor 46. In alternate embodiments, such parameters may be selected so that at least a portion of a human hand must be in contact with the rear surface 14R of the rear wall 14G in order to trigger the sensor 46. In any case, the sensor 46 may, in some embodiments, be configured to be responsive to different distances of the object, e.g., fingers and/or hand, from the rear surface 14R of the rear wall 14G of the handle base 14 to produce distinguishably different sensor output signal magnitudes, and in some such embodiments such different distances of the object from the rear surface 14R of the handle base 14 may result in different functions carried out by the door handle assembly 10 and/or by one or more actuators or systems of the motor vehicle.

Figure 10:
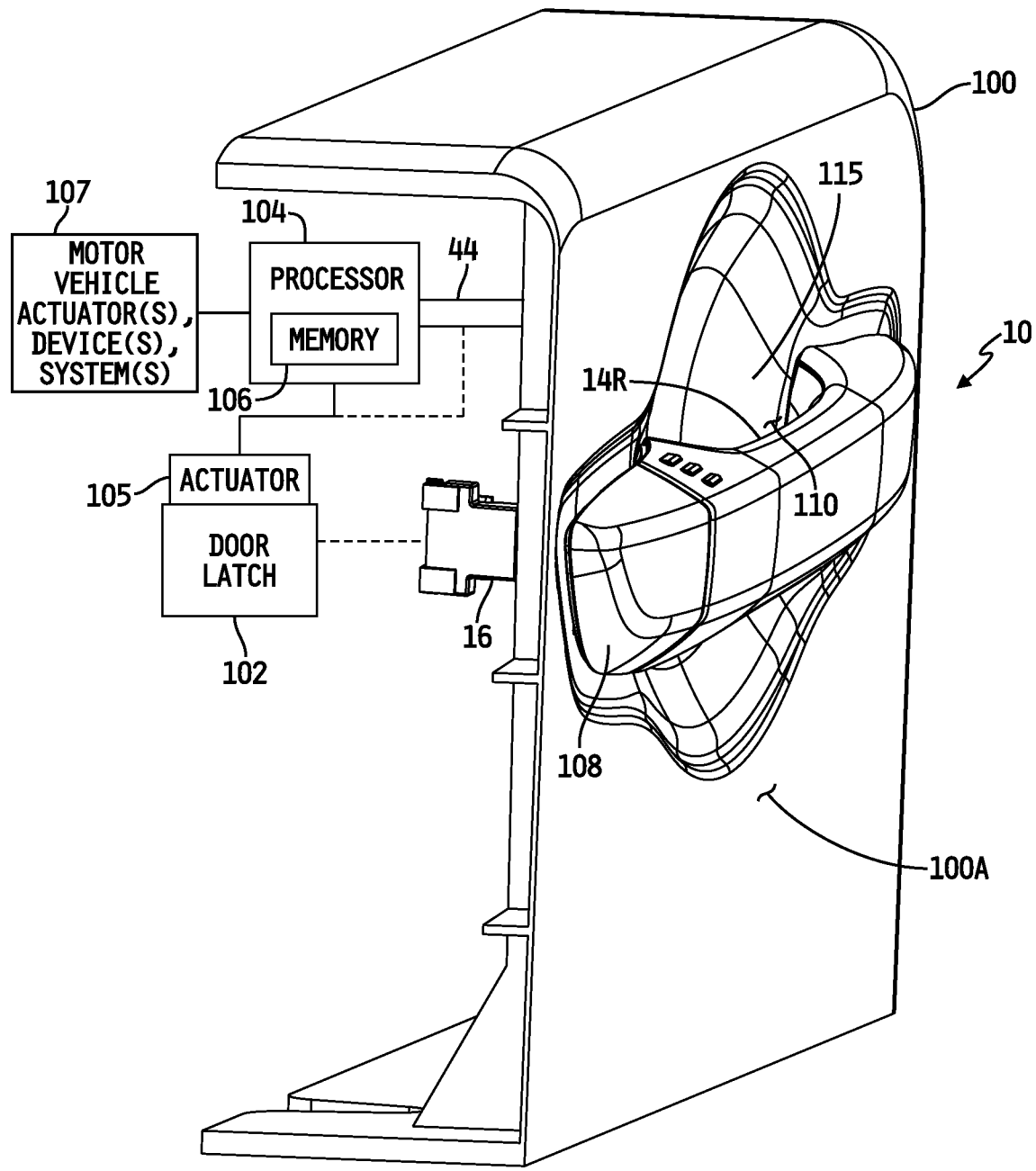
FIG. 10 is a front perspective and partial cutaway view of the door handle assembly of FIGS. 1-9 shown mounted to a door of a motor vehicle and operatively connected to a door latch and processor of the motor vehicle.

Referring now to FIG. 10, the door handle assembly 10 is shown mounted to an entry door 100 of a motor vehicle. In the illustrated embodiment, the latch actuator 16 extends through the outer skin 100A of the vehicle door 100 and is mechanically linked via a linkage L to a conventional door latch 102 of the vehicle door 100. A door lock and unlock (and/or door latch/unlatch) actuator 105 is coupled to the door latch 102. The door lock and unlock actuator 105 is responsive to a lock signal to lock the door latch 102 and to an unlock signal to unlock the door latch 102 (and/or to a latch signal to latch the door latch 102 and/or to an unlatch signal to unlatch the door latch 102). In the embodiment illustrated in FIG. 10, the wiring 44 connected to the circuit board 40 of the door handle assembly 10 is electrically connected to a processor 104 located within the motor vehicle, e.g., as part of a motor vehicle controller or control unit, and the processor 104 illustratively includes or is electrically connected to a memory unit 106. In such embodiments, the circuitry onboard the circuit board 40 of the door handle assembly 10 may or may not include a processor and a memory. In embodiments in which the door handle assembly 10 does not include a processor and a memory, the memory unit 106 illustratively has stored therein instructions which, when executed by the processor 104, cause the processor 104 to solely control operation of the door handle assembly 10 and the door latch 102. In embodiments in which the door handle assembly 10 includes a processor and a memory, such a memory may include instructions stored therein which, when executed by the onboard processor, cause the on-board processor to control operation of the door handle assembly 10 and the memory unit 106 illustratively has stored therein instructions, which when executed by the processor 104, cause the processor 104 to control operation of the door latch 102. In still other embodiments in which the door handle assembly 10 includes a processor and a memory, the processor 104 and memory 106 may be omitted and the memory onboard the circuit board 40 illustratively has stored therein instructions which, when executed by the processor onboard the circuit board 40, cause the onboard processor to solely control operation of the door handle assembly 10 and the door latch 102. The locking and unlocking actuator 105 will be described below as being controlled solely by the processor 104, under the control of instructions stored in the memory 106, although it will be understood that such control may alternatively be carried out by a combination of the processor 104 and a processor onboard the circuit board 40 of the door handle assembly 10 or solely by a processor onboard the circuit board 40 of the door handle assembly 10. In some embodiments, the processor 104 and/or a processor on-board the circuit board 40 of the door handle assembly may be operatively coupled, e.g., electrically connected, to one or more motor vehicle actuators, devices or systems 107 in embodiments in which signals produced by the sensor 46 and/or the sensor 62 are used to control one or more structures and/or features of the motor vehicle as briefly described above. In any case, in the illustrated embodiment a bezel 108 is mounted to the vehicle door 100, and the door handle assembly 10 is mounted to the vehicle door 100 adjacent to the bezel 108 such that a space or gap 110 is formed between a portion 115 of the outer surface of the outer skin 100A of the door 100 and the rear surface 14R of the arcuate rear wall 14G of the handle base 14.

Figure 11:
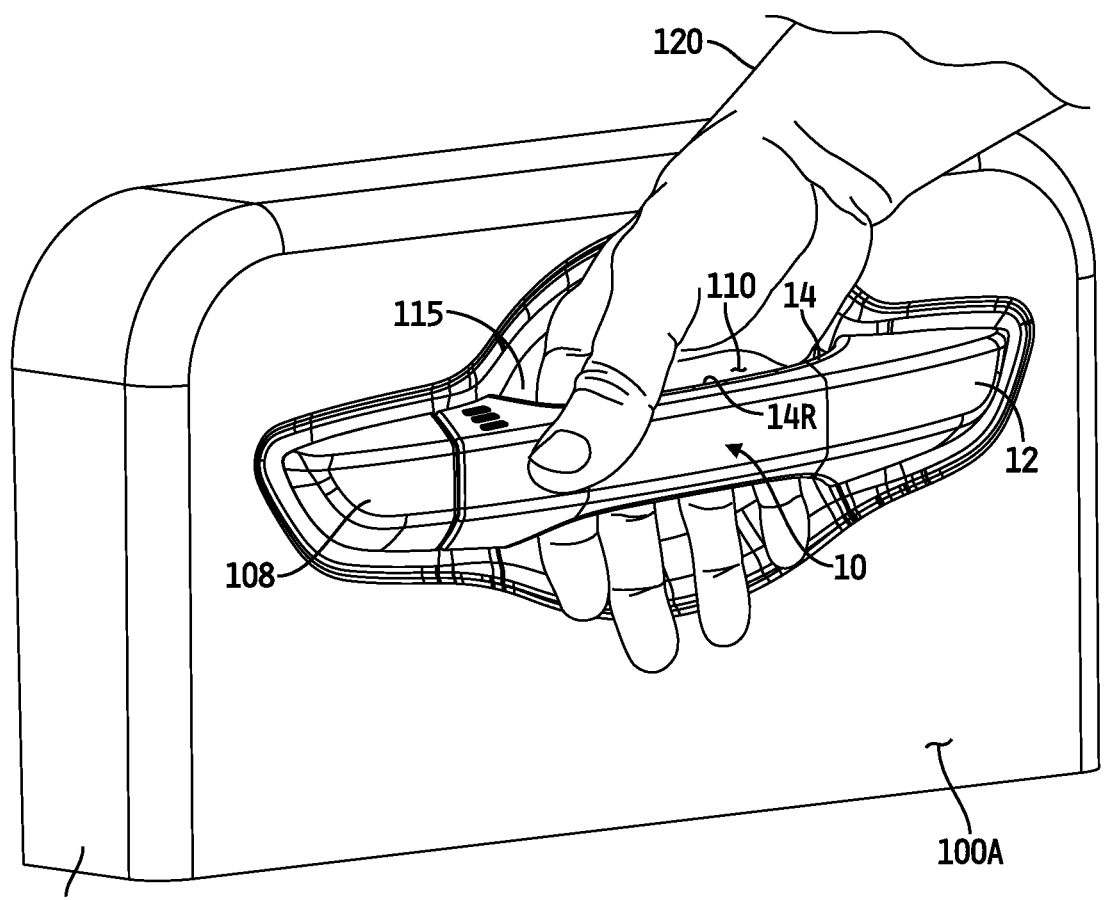
FIG. 11 is a front perspective view of the door handle assembly of FIGS. 1-9 mounted to a door of a motor vehicle, shown with a portion of a hand inserted between the door and the door handle assembly which causes a detectable change in the output of one of the sensors carried by the door handle assembly.
Figure 12:
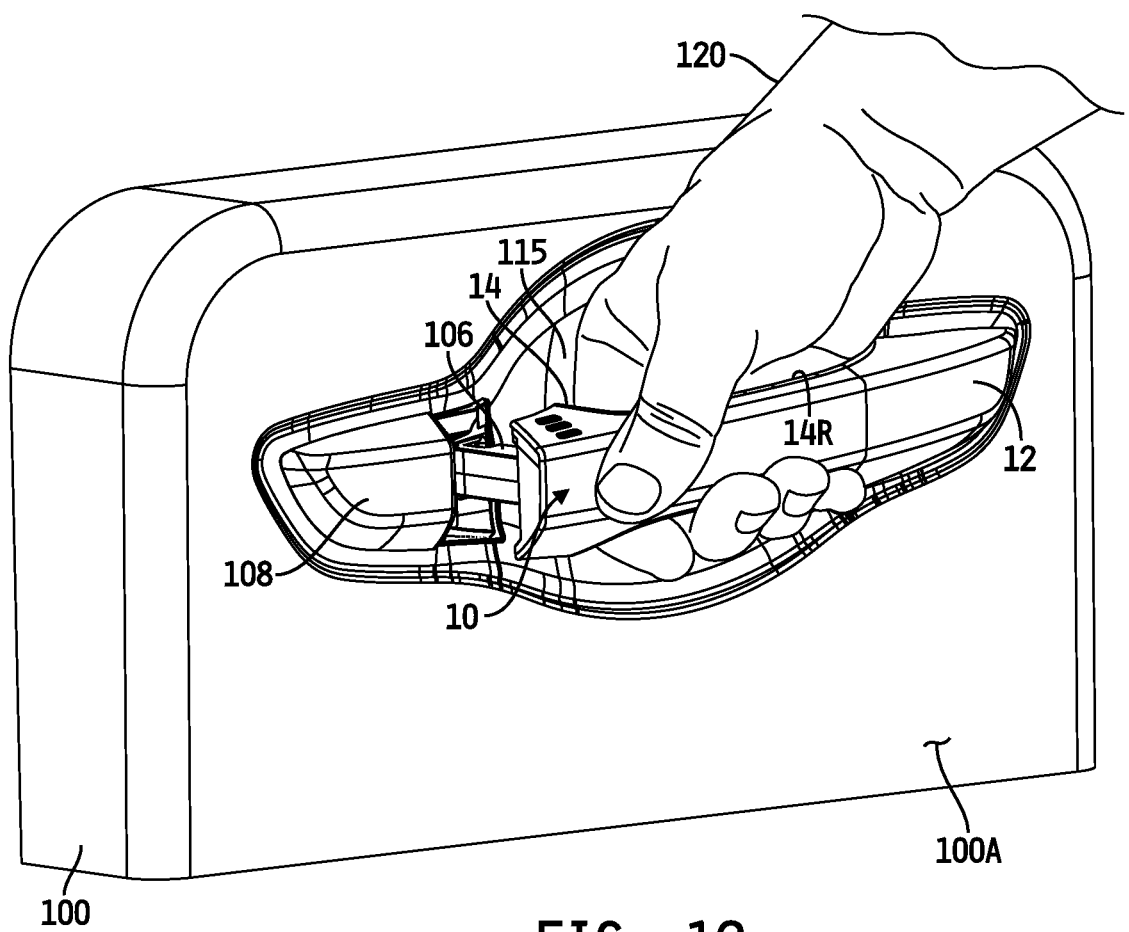
FIG. 12 is a front perspective view similar to FIG. 11 showing the hand exerting an outward force against the door handle assembly to actuate the door latch actuator and open the door of the motor vehicle.
Figure 13:
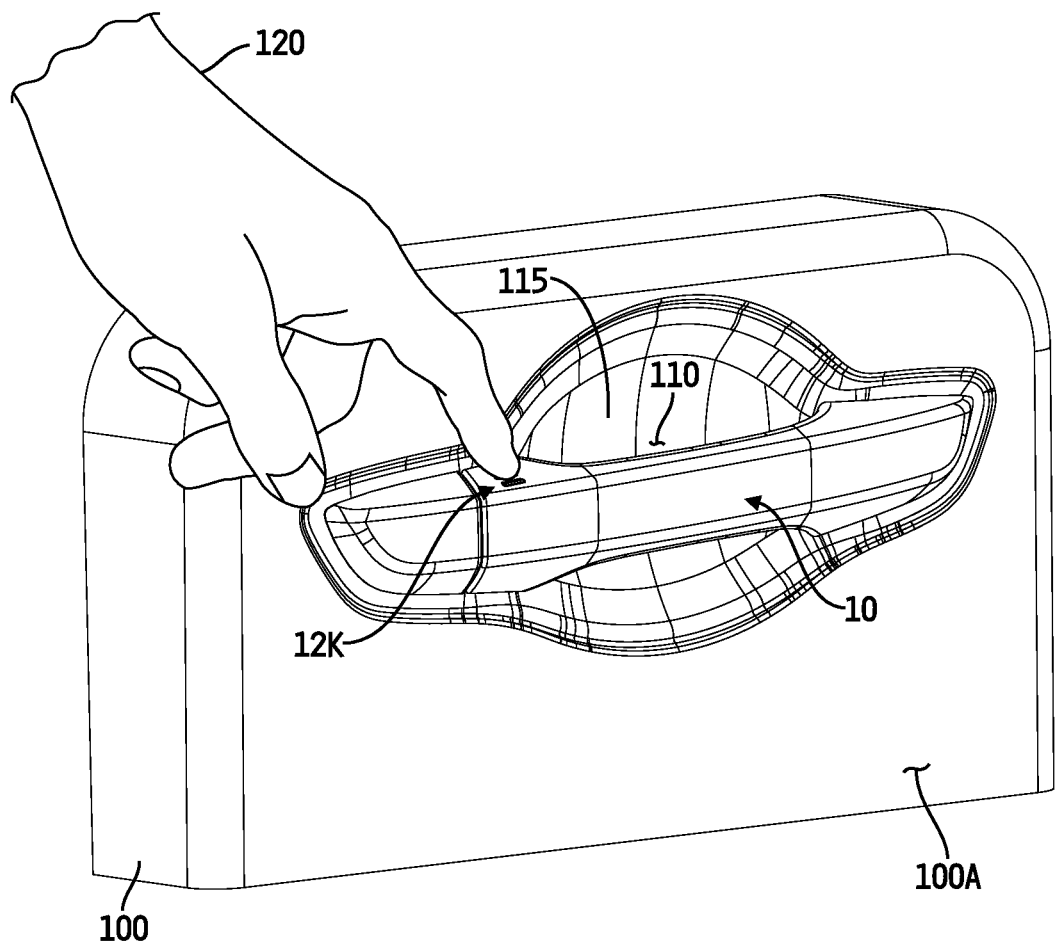
FIG. 13 is a front perspective view similar to FIGS. 11 and 12 showing exertion of a force or pressure against a portion of the grip cover which causes a detectable change in the electrical output of another of the sensors carried by the door handle assembly.

Referring now to FIGS. 11-13, operation of the door handle assembly 10 will be described. In the illustrated embodiment, the door latch 102 has a conventional latched condition in which the door latch 102 engages the latch actuator 16 to maintain the vehicle door 100 closed and which prevents the door 100 from opening on its own, and an unlatched condition in which the door latch 102 releases the latch actuator 16 to allow the vehicle door 100 to be opened for vehicle ingress and egress. The door latch 102 illustratively has a locked state and an unlocked state as is also conventional, which are controlled by the actuator 105. In the unlocked and latched state of the door latch 102, the door 100 is closed and a user may grasp and pull the combination of the handle base 14 and the grip cover 12 outwardly away from the door 100 to cause the latch actuator 16 to unlatch the door latch 102 so that the user may open the door 100, e.g., by continuing to pull outwardly on the combination of the handle base 14 and grip cover 12. In the locked and latched state of the door latch 102, the latch actuator 16 is prevented from unlatching the door latch 102, thereby preventing the door 100 from being opened. Such operation of the latch actuator 16 and the door latch 102 is conventional.

The sensors 46, 62 carried by the door handle assembly 10 illustratively provide for controlled locking and unlocking of the door latch 102 as just described. In the illustrated embodiment, the sensor 46 illustratively provides for controlled unlocking of the door latch 102 and the sensor 62 illustratively provides for controlled locking of the door latch 102, although in alternate embodiments the foregoing functions of the sensors 46, 62 may be reversed. As illustrated in FIG. 11, the door latch 102 in its locked state may be unlocked by extending at least a portion of a hand 120 into the space 110 between the rear surface 14R of the rear wall 14G of the handle base 14 and the portion 115 of the outer skin 100A of the door 100. In one embodiment, the sensor 46 is illustratively configured to be triggered when the portion of the hand 120 is within a designed distance of, but not in contact with, the rear surface 14R. In alternate embodiments, the sensor 46 may be configured to be triggered when the portion of the hand 120 is in contact with the rear surface 14R of the rear wall 14G of the handle base 14. In any case, the output signal of the sensor 46 is monitored by the processor 104, under control of instructions stored in the memory 106, and such triggering of the sensor 46 creates a detectable change in the output signal of the sensor 46 to which the processor 104 is responsive to control the door latch 102 to its unlocked state. Thereafter, the door handle assembly 10 may be actuated as illustrated in FIG. 12 and as described above to cause the latch actuator 16 to unlatch the door latch 102 so that the door 10 may be opened for ingress or egress. In some embodiments, the processor 104 may be additionally or alternatively responsive to triggering of the sensor 46 to control the door latch 102 to its unlatched state. Alternatively or additionally, in embodiments in which the door latch assembly 102 is or includes an automatic door opening/closing/assist apparatus and the motor vehicle door is provided in the form of an access closure with power open/close assist features, e.g., such as a power lift gate, a power rear door, a power side door, a power sliding door or the like, the processor 104 may be additionally or alternatively responsive to triggering of the sensor 46 to control the door latch 102 to activate the door latch assembly 102 to automatically open the motor vehicle door.

As illustrated by example in FIG. 13, the door latch 102 in its unlocked state may be locked by applying a force or pressure, e.g., by a digit of a user's hand 120, to the portion 12K of the grip cover 12 sufficiently to cause the sensor 62 to be triggered as described above. The output signal of the sensor 62 is monitored by the processor 104, under control of instructions stored in the memory 106, and such triggering of the sensor 62 creates a detectable change in the output signal of the sensor 62 to which the processor 104 is responsive to control the door latch 102 to its locked state. Thereafter, the door latch 102 will prevent actuation of the door handle assembly 10 from causing the latch actuator 16 to unlatch the door latch 102. In some embodiments, the processor 104 may be additionally or alternatively responsive to triggering of the sensor 62 to control the door latch 102 to its latched state. Alternatively or additionally, in embodiments in which the door latch assembly 102 is or includes an automatic door opening/closing/assist apparatus and the motor vehicle door is provided in the form of an access closure with power open/close assist features, e.g., such as a power lift gate, a power rear door, a power side door, a power sliding door or the like, the processor 104 may be additionally or alternatively responsive to triggering of the sensor 62 to control the door latch 102 to activate the door latch assembly 102 to automatically close the motor vehicle door.

In some embodiments, triggering of at least one of the sensors 46, 62 may cause the processor 104 to control other aspects of the door handle assembly 10. For example, in some embodiments, the circuit board 40, the circuit board carrier 30, the handle base 14 and/or the grip cover 12 may have one or more illumination sources mounted thereto, and in such embodiments the instructions stored in the memory 106 may include instructions which, when executed by the processor 104, cause the processor 104 to activate one or more such illumination sources in response to detected trigger of either or both of the sensors 46, 62.

Alternatively or additionally, the processor 104 may be programmed to control the state of the door latch 12 based on sequential triggering of at least one of the sensors 46, 62 according to a predefined or programmable triggering sequence. As one specific example, if triggering of the sensor 46=1 and triggering of the sensor 62=2, the instructions stored in the memory 106 may include instructions which, when executed by the processor 104, cause the processor 104 to control the door latch 102 from its locked state to its unlocked state (and/or to control the door latch 102 from its latched state to its unlatched state and/or to control the door latch 102 to automatically open the vehicle door) upon detection of the sensor triggering sequence 2212. In some embodiments, the sensor triggering sequence may be a predefined sequence, and in other embodiments the instructions stored in the memory 106 may include instructions which, when executed by the processor 104, cause the processor 104 to execute a programming mode in which a "private" triggering sequence may be programmed by a user. In some such embodiments, different users of the vehicle may program different private triggering sequences and in such embodiments the processor 104 may be configured to control the door latch 102 from its locked state to its unlocked state upon detection of any such programmed triggering sequence. In any case, the processor 104 may be programmed in some such embodiments to control the door latch 102 from its unlocked state to its locked state (and/or to control the door latch 102 from its unlatched state to its latched state and/or to control the door latch 102 to automatically close the vehicle door) upon detection of a single triggering of the sensor 62 as described above, or upon detection of a predefined or programmed sequence of sensor trigger events of either one or both of the sensors 46, 62 as just described.

In some embodiments, triggering of at least one of the sensors 46, 62, either singly or sequentially, may cause the processor 104 to control other aspects of the motor vehicle as described briefly above. In such cases, the processor 104 (and/or the processor carried on the circuit board 40, if any) may be configured to process a single trigger signal or a sequence of trigger signals produced by either or both of the sensors, e.g., the sensors 46, 62, and/or other or additional sensors carried by the assembly 10, to selectively control, i.e., activate, deactivate, select or control one or more actuators, devices or systems 107 to thereby activate, deactivate, select, control and/or position one or more driver and/or passenger settings of the motor vehicle. Examples of such one or more inter-vehicle driver and/or passenger settings of the motor vehicle may include, but are not limited to, one or more interior light settings, one or more entertainment system settings, one or more climate control settings, one or more seat position settings, one or more steering wheel position settings, one or more rear view mirror position settings, one or more side mirror position settings, one or more window and/or sunroof position settings, and/or the like. Examples of such one or more external vehicle driver and/or passenger settings of the motor vehicle may include, but are not limited to, one or more exterior structures and/or features of motor vehicle when the vehicle is parked/stationary such as a position of one or more of motor vehicle side mirrors, e.g., folded against the motor vehicle or unfolded to an operative position, one or more window and/or sunroof position settings, one or more external motor vehicle lights, or the like.

While the disclosure has been illustrated and described in detail in the drawings and foregoing description, such an illustration and description is to be considered as exemplary and not restrictive in character, it being understood that only illustrative embodiments have been shown and described and that all changes and modifications consistent with the disclosure and recited claims are desired to be protected. For example, while the door handle assembly 10 illustrated in the attached figures is depicted, and has been described, as having a capacitive sensor 46 positioned adjacent to the rear surface 14R of the wall 14G of the handle base 14 and an inductive sensor positioned adjacent to a portion of a wall of the grip cover 12, it will be understood that embodiments in which both sensors 46, 62 are capacitive sensors, in which both sensors 46, 62 are inductive sensors, and/or in which the sensor positioned adjacent to the rear surface 14R of the rear wall 14G of the handle base 14 is an inductive sensor and the sensor positioned adjacent to a portion of a wall of the grip cover 12 is a capacitive sensor, are all contemplated by this disclosure. As another example, while the door handle assembly 10 has been described as having a sensor positioned adjacent to the rear surface 14R of the rear wall 14G of the handle base 14 which may be triggered to control the door latch 102 from its locked state to its unlocked state, this disclosure contemplates embodiments in which such a sensor may be triggered to control the door latch 102 from its unlocked state to its locked state. Likewise, while the door handle assembly 10 has been described as having a sensor positioned adjacent to a portion of a wall of the grip cover 12 which may be triggered to control the door latch 102 from its unlocked state to its locked state, this disclosure contemplates embodiments in which such a sensor may be triggered to control the door latch 102 from its locked state to its unlocked state. As still another example, while the door handle assembly 10 has been described as including two sensors mounted separately from one another, this disclosure contemplates embodiments in which both sensors are mounted together, e.g., on one or more substrates mounted to a sensor cartridge received in a slot formed in the grip cover 12 which extends the length, or at least part of the length, of the internal space 12S thereof, on one or more substrates mounted directly to the grip cover 12, or on one or more substrates mounted to the handle base 14. As yet a further example, while the door handle assembly 10 is illustrated in FIGS. 10-13 and described as being operatively mounted to a motor vehicle door 100, it will be understood that the door handle assembly may alternatively be mounted, in whole or in part, to other structures of the motor vehicle including, for example, but not limited to, a sliding motor vehicle door, a rear hatch, trunk or swinging door of the motor vehicle or a stationary portion of the motor vehicle such as, any of the so-called "A," "B" or "C" pillars of the motor vehicle.

What is claimed is:

1. A door handle assembly for a motor vehicle door, the door handle assembly comprising:

a first housing component having an inner surface and an outer surface, a second housing component having an inner surface and an outer surface, the first and second housing components configured to be secured together to form a housing with the inner surfaces of the first and second housing components facing one another, the housing configured to be mounted to the motor vehicle door to define a door handle with at least part of the outer surface of the first housing component spaced apart from and facing the motor vehicle door, a first sensor mounted in the housing along a first detection surface defined by at least a portion of the outer surface of the first housing component, the first sensor configured to produce a first sensor signal upon detection of one of an object within a detection proximity of the first detection surface and deflection of at least a portion of the inner surface of the first housing component opposite the first detection surface to within a detection proximity of the first sensor, and a second sensor mounted in the housing along a second detection surface defined by at least a portion of the outer surface of the second housing component, the second sensor configured to produce a second sensor signal upon detection of one of an object within a detection proximity of the second detection surface and deflection of at least a portion of the inner surface of the second housing component opposite the second detection surface to within a detection proximity of the second sensor, wherein the first and second sensor signals are configured to enable any of locking, unlocking, latching, unlatching, automatically opening and automatically closing of the motor vehicle door.

2. The door handle assembly of claim 1, wherein the first sensor signal is configured to enable one of unlocking and unlocking of the motor vehicle door and the second sensor signal is configured to enable the other of locking and unlocking of the motor vehicle door.

3. The door handle assembly of claim 1, wherein one of the first and second sensor signals is configured to enable locking and unlocking of the motor vehicle door, and the other of the first and second sensor signals is configured to enable unlatching of the motor vehicle door.

4. The door handle assembly of claim 1, wherein the first sensor is a capacitive proximity sensor configured to produce the first sensor signal in the form of a detectable change in an electric field produced by the capacitive proximity sensor upon detection of the object within the detection proximity of the first detection surface.

5. The door handle assembly of claim 4, wherein the second sensor is an inductive proximity sensor configured to produce the second sensor signal in the form of a detectable change in an electromagnetic field produced by the inductive proximity sensor upon detection of deflection of the at least a portion of the inner surface of the second housing component opposite the second detection surface to within the detection proximity of the inductive proximity sensor.

6. The door handle assembly of claim 4, wherein the second sensor is another capacitive proximity sensor configured to produce the second sensor signal in the form of a detectable change in an electric field produced by the another capacitive proximity sensor upon detection of the object within the detection proximity of the second detection surface.

7. The door handle assembly of claim 1, wherein the first sensor is an inductive proximity sensor configured to produce the first sensor signal in the form of a detectable change in an electromagnetic field produced by the inductive proximity sensor upon detection of deflection of the at least a portion of the inner surface of the first housing component opposite the first detection surface to within the detection proximity of the inductive proximity sensor.

8. The door handle assembly of claim 7, wherein the second sensor is a capacitive proximity sensor configured to produce the second sensor signal in the form of a detectable change in an electric field produced by the capacitive proximity sensor upon detection of the object within the detection proximity of the second detection surface.

9. The door handle assembly of claim 7, wherein the second sensor is another inductive proximity sensor configured to produce the second sensor signal in the form of a detectable change in an electromagnetic field produced by the another inductive proximity sensor upon detection of deflection of the at least a portion of the inner surface of the second housing component opposite the second detection surface to within the detection proximity of the another inductive proximity sensor.

10. The door handle assembly of claim 1, further comprising:
   a processor mounted in the housing, and
   a memory mounted in the housing and having instructions stored therein executable by the processor cause the processor to be responsive to the first and second sensor signals to control any of the combinations of locking, unlocking, latching, unlatching, automatically opening and automatically closing of the motor vehicle door.

11. A door handle assembly for a motor vehicle door, the door handle assembly comprising:
   a first housing component having an inner surface and an outer surface,
   a second housing component having an inner surface and an outer surface, the first and second housing components configured to be secured together to form a housing with the inner surfaces of the first and second housing components facing one another, the housing configured to be mounted to the motor vehicle door to define a door handle with at least part of the outer surface of the first housing component spaced apart from and facing the motor vehicle door,
   a first sensor mounted in the housing along a first detection surface defined by at least a portion of the part of outer surface of the first housing component facing the motor vehicle door, the first sensor configured to produce a first sensor signal upon deflection of at least a portion of the inner surface of the first housing component opposite the first detection surface to within a detection proximity of the inductive proximity sensor, and
   a capacitive proximity sensor mounted in the housing along a second detection surface defined by at least a portion of the outer surface of the second housing component, the capacitive proximity sensor configured to produce a second sensor signal upon detection of an object within a detection proximity of the second detection surface,
   wherein the first and second sensor signals are configured to enable any of locking, unlocking, latching, unlatching, automatically opening and automatically closing of the motor vehicle door.

12. The door handle assembly of claim 11, wherein the first sensor signal is configured to enable one of unlocking and unlocking of the motor vehicle door and the second sensor signal is configured to enable the other of locking and unlocking of the motor vehicle door.

13. The door handle assembly of claim 11, wherein one of the first and second sensor signals is configured to enable locking and unlocking of the motor vehicle door, and the other of the first and second sensor signals is configured to enable unlatching of the motor vehicle door.

14. The door handle assembly of claim 11, wherein the first sensor is an inductive proximity sensor configured to produce the first sensor signal in the form of a detectable change in an electromagnetic field produced by the inductive proximity sensor upon detection of deflection of the at least a portion of the inner surface of the first housing component opposite the first detection surface to within the detection proximity of the inductive proximity sensor.

15. The door handle assembly of claim 14, further comprising:
- a processor mounted in the housing, and
- a memory mounted in the housing and having instructions stored therein executable by the processor cause the processor to be responsive to a single detectable change in the electromagnetic field produced by the inductive proximity sensor to produce a control signal to lock, unlock, unlatch, automatically open or automatically close the motor vehicle door.

16. The door handle assembly of claim 11, wherein the capacitive proximity sensor is configured to produce the second sensor signal in the form of a detectable change in an electric field produced by the capacitive proximity sensor upon detection of the object within the detection proximity of the second detection surface.

17. The door handle assembly of claim 16, further comprising:
- a processor mounted in the housing, and
- a memory mounted in the housing and having instructions stored therein executable by the processor cause the processor to be responsive to a single detectable change in the electric field produced by the capacitive proximity sensor to produce a control signal to lock, unlock, unlatch, automatically open or automatically close the motor vehicle door.

\* \* \* \* \*